United States Patent
Sheu et al.

(10) Patent No.: US 10,892,186 B2
(45) Date of Patent: Jan. 12, 2021

(54) INTEGRATION OF ALD COPPER WITH HIGH TEMPERATURE PVD COPPER DEPOSITION FOR BEOL INTERCONNECT

(71) Applicant: Applied Materials, Inc., Santa Clara, CA (US)

(72) Inventors: Ben-Li Sheu, Sunnyvale, CA (US); Feng Q. Liu, San Jose, CA (US); Tae Hong Ha, San Jose, CA (US); Mei Chang, Saratoga, CA (US); Shirish Pethe, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 43 days.

(21) Appl. No.: 16/159,128

(22) Filed: Oct. 12, 2018

(65) Prior Publication Data

US 2019/0115254 A1    Apr. 18, 2019

Related U.S. Application Data

(60) Provisional application No. 62/572,447, filed on Oct. 14, 2017.

(51) Int. Cl.
*H01L 21/768* (2006.01)
*C23C 16/34* (2006.01)
(Continued)

(52) U.S. Cl.
CPC ...... *H01L 21/76843* (2013.01); *C23C 14/025* (2013.01); *C23C 14/046* (2013.01); *C23C 14/14* (2013.01); *C23C 14/34* (2013.01); *C23C 16/045* (2013.01); *C23C 16/18* (2013.01);

*C23C 16/34* (2013.01); *C23C 16/4411* (2013.01); *C23C 16/45527* (2013.01); *C23C 16/45544* (2013.01); *C23C 16/45553* (2013.01)

(58) Field of Classification Search
CPC ......... H01L 2924/0002; H01L 2924/00; H01L 21/76864; H01L 21/28562; H01L 2221/1089; H01L 21/2855; H01L 21/28556; H01L 21/28194
See application file for complete search history.

(56) References Cited

U.S. PATENT DOCUMENTS 5,085,731 A    2/1992    Norman et al.
6,090,964 A    7/2000    Rhee et al.
(Continued)

FOREIGN PATENT DOCUMENTS

EP    1754800 A1    2/2007
WO    2014077089 A1    5/2014
WO    2014103588 A1    7/2014

OTHER PUBLICATIONS

Becht, M., et al., "Nickel Thin Films Grown by MOCVD Using Ni(dmg)2 as Precursor", Journal of Physical IV, Symposium C5 supplement to Journal of Physics 11, vol. 5, 1995, 465-472.
(Continued)

*Primary Examiner* — Jaehwan Oh
(74) *Attorney, Agent, or Firm* — Servilla Whitney LLC

(57) ABSTRACT

Methods and apparatus to fill a feature with a seamless gapfill of copper are described. A copper gapfill seed layer is deposited on a substrate surface by atomic layer deposition followed by a copper deposition by physical vapor deposition to fill the gap with copper.

13 Claims, 4 Drawing Sheets

(51) Int. Cl.
*C23C 16/455* (2006.01)
*C23C 16/44* (2006.01)
*C23C 14/34* (2006.01)
*C23C 16/04* (2006.01)
*C23C 14/04* (2006.01)
*C23C 14/02* (2006.01)
*C23C 16/18* (2006.01)
*C23C 14/14* (2006.01)

(56) References Cited

U.S. PATENT DOCUMENTS

| | | | |
|---|---|---|---|
| 6,184,137 | B1 | 2/2001 | Ding et al. |
| 6,369,256 | B1 | 4/2002 | Chi et al. |
| 6,440,854 | B1* | 8/2002 | Rozbicki ............. H01L 21/2855 |
| | | | 257/E21.169 |
| 6,822,107 | B1 | 11/2004 | Baum et al. |
| 6,982,341 | B1 | 1/2006 | Kim et al. |
| 7,241,912 | B2 | 7/2007 | Xu et al. |
| 7,462,732 | B2 | 12/2008 | Kim et al. |
| 7,531,031 | B2 | 5/2009 | Xu et al. |
| 7,714,155 | B2 | 5/2010 | Sato et al. |
| 7,749,361 | B2* | 7/2010 | Chen ..................... C23C 14/046 |
| | | | 204/192.17 |
| 7,749,893 | B2 | 7/2010 | Redeker et al. |
| 8,105,937 | B2 | 1/2012 | Cheng et al. |
| 8,247,030 | B2 | 8/2012 | Suzuki et al. |
| 8,263,795 | B2 | 9/2012 | Norman et al. |
| 2001/0041250 | A1* | 11/2001 | Werkhoven ............. C30B 25/14 |
| | | | 428/212 |
| 2008/0171890 | A1 | 7/2008 | Kim et al. |
| 2009/0256263 | A1* | 10/2009 | Bonilla ............... H01L 23/5226 |
| | | | 257/762 |
| 2010/0038789 | A1* | 2/2010 | Cheng ............... H01L 21/76846 |
| | | | 257/753 |
| 2010/0126351 | A1 | 5/2010 | Hosokawa et al. |
| 2012/0058270 | A1 | 3/2012 | Winter et al. |
| 2012/0070981 | A1 | 3/2012 | Clendenning et al. |
| 2013/0164456 | A1 | 6/2013 | Winter |
| 2013/0330473 | A1 | 12/2013 | Winter et al. |
| 2014/0174323 | A1 | 6/2014 | Wada et al. |
| 2016/0032455 | A1 | 2/2016 | Liu et al. |
| 2016/0305024 | A1* | 10/2016 | Lee ......................... C23C 16/34 |

OTHER PUBLICATIONS

Chung, Taek-Mo, et al., "Volatile Nickel Aminoalkoxide Complexes as Liquid Precursors for Non-volatile Memory Device of NiO Films by ALD", Bull. Korean Chem. Soc. vol. 32, No. 3, 2011, 783-784.

Dey, G., et al., "Mechanism for the atomic layer deposition of copper using diethylzinc as the reducing agent—a Density Functional Theory study using gas phase molecules as a model", Journal of Physical Chemistry A vol. 116 Issue 35, 2012, 8893-8901.

Knisley, Thomas Joseph, et al., "New Precursors and Chemistry for the Growth of Transition Metal Films by Atomic Layer Deposition", Ph. D. Chemistry Dissertation, Wayne State University Graduate School, 2012, 120 pages.

Lee, Byoung, et al., "Low-Temperature Atomic Layer Deposition of Copper Metal Thin Films: Self-Limiting Surface Reaction of Copper Dimethylamino-2-propoxide with Diethylzinc", Angew. Chem. Int. Ed. vol. 48, 2009, 4536-4539.

Park, Jung Woo, et al., "Synthesis of Cu(II) aminoalkoxide complexes and their unusual thermolysis to Cu(0)", Inorganic Chemistry Communications vol. 7, 2004, 463-466.

Saraswat, Krishna, "Interconnect Cu Slides", Stanford University Class ee311 Notes, 2006, 18 pages.

Vidjayacoumar, Balamurugan, et al., "Investigation of AlMe3, BEt3, and ZnEt2 as Co-Reagents for Low-Temperature Copper Metal ALD/Pulsed-CVD", Chem. Mater. 22, 2010, 4844-4853.

Vidjayacoumar, B., et al., "Solution Reactivity Studies for Identification of Promising New ALD Pulsed-CVD Reaction Chemistries", ECS Transactions vol. 50 Issue 13, 2012, 53-66.

* cited by examiner

INTEGRATION OF ALD COPPER WITH HIGH TEMPERATURE PVD COPPER DEPOSITION FOR BEOL INTERCONNECT

CROSS-REFERENCE TO RELATED APPLICATIONS

This application claims priority to U.S. Provisional Application No. 62/572,447, filed Oct. 14, 2017, the entire disclosure of which is hereby incorporated by reference herein.

TECHNICAL FIELD

The present disclosure relates generally to apparatus and methods for depositing thin films. In particular, the disclosure relates to methods for depositing copper films for back-end-of-line (BEOL) interconnects.

BACKGROUND

Integrated circuits are made possible by processes which produce intricately patterned material layers on substrate surfaces. Producing patterned materials on a substrate requires controlled methods for deposition and removal of material layers. Modern semiconductor manufacturing processing applies increasing emphasis on the integration of films without air breaks between process steps. Such a requirement poses a challenge for equipment manufacturers to allow integration of various process chambers into a single tool.

The gapfill process is an important stage of semiconductor manufacturing. Gapfill processes are used to fill high aspect ratio gaps (or features) with an insulating or conducting material. For example, shallow trench isolation, inter-metal dielectric layers, passivation layers, dummy gate, etc. As device geometries shrink and thermal budgets are reduced, defect-free filling of gaps and other features becomes increasingly difficult due to limitations of conventional deposition processes.

Many deposition methods deposit more material on the top region than on the bottom region of a feature. These processes often form a mushroom shape film profile at the top of the feature. As a result, the top part of a feature sometimes pinches off prematurely leaving seams or voids within the feature's lower portions. This problem is more prevalent in smaller features as well as features with higher aspect ratios.

Copper is often used as an interconnect material in BEOL processes. Current high temperature physical vapor deposition (PVD) copper reflow deposition is strongly dependent upon substrate material to promote flow of copper into high aspect ratio device structures. Therefore, there is a need in the art for apparatus and methods to deposit copper films with less substrate material dependence and better reflow characteristics.

SUMMARY

One or more embodiments of the disclosure are directed to methods of gapfilling. A copper gapfill seed layer is formed by atomic layer deposition (ALD) on a substrate surface having a feature thereon. The atomic layer deposition occurs at a first temperature. The feature is filled with copper by physical vapor deposition (PVD) at a second temperature greater than the first temperature to form a seam-free gapfill film.

Additional embodiments of the disclosure are directed to methods comprising providing a substrate having a metal underlayer with a patterned dielectric layer thereon. The patterned dielectric layer defines one or more features in a surface of the substrate. The features have sidewalls and a bottom. The sidewalls comprise the patterned dielectric layer and the bottom comprises the metal underlayer. A diffusion barrier is formed on the substrate surface and on the sidewalls of the features. An optional liner is formed on the diffusion barrier on the substrate surface, sidewalls of the features and on the bottom of the features. A copper gapfill seed layer is formed by atomic layer deposition (ALD) at a first temperature on the substrate surface. The feature is filled with copper by physical vapor deposition (PVD) at a second temperature greater than the first temperature to form a seam-free gapfill film.

Further embodiments of the disclosure are directed to processing platforms comprising a central transfer station, an atomic layer deposition chamber connected to the central transfer station and a physical vapor deposition chamber connected to the central transfer station. A robot is in the central transfer station to move a substrate from the atomic layer deposition chamber to the physical vapor deposition chamber. One or more controllers are connected to the central transfer station, the atomic layer deposition chamber, the physical vapor deposition chamber and the robot. The one or more controllers have one or more configurations selected from a first configuration to move a substrate into the atomic layer deposition chamber, a second configuration to deposit a copper gapfill seed layer on a substrate in the atomic layer deposition chamber by controlling a substrate temperature and a flow of a copper precursor, a third configuration to move the substrate from the atomic layer deposition chamber to the physical vapor deposition chamber, and a fourth configuration to deposit a copper film on the copper gapfill seed layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
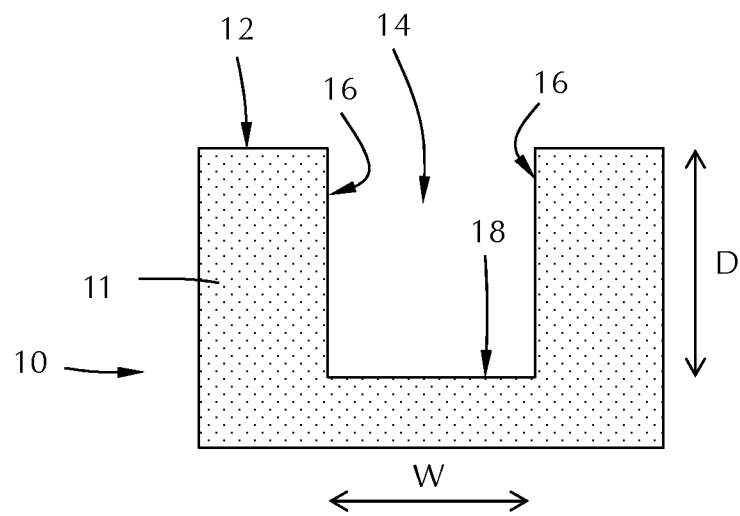
FIG. 1 shows a schematic cross-sectional view of a single material substrate with a feature in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "wafer" or "substrate" as used herein refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the disclosure provide methods to deposit copper films in a gap without forming a seam using a PVD copper reflow. Some embodiments advantageously provide methods which employ highly conformal ALD CuN (copper nitride) formed in sequential thermal ALD mode using a copper precursor (e.g., Cu(DMAP)$_2$) and a reactant (e.g., ammonia) at temperatures in the range of about 80° C. to about 120° C. on substrates such as ALD TaN with a CVD Ru or CVD Co liner.

Some embodiments advantageously provide methods to convert ALD CuN into high purity and surface-smooth Cu (at less than 35 Å-50 Å thickness for initial CuN). The conversion can be performed by annealing with H$_2$ and/or Ar gas flow at a temperature greater than or equal to about 130° C. In some embodiments, the conversion is accomplished by pre-heating in high temperature vacuum, such as high temperature PVD Cu reflow chamber.

FIG. 1 shows a cross-sectional view of a substrate 10 made of a first material 11 with a first material surface 12 and a feature 14 (e.g. a trench). As used in this regard, the term "feature" means any intentional surface irregularity. The shape of the feature 14 can be any suitable shape including, but not limited to, trenches and cylindrical vias. In specific embodiments, the feature 14 is a trench. For purposes of this disclosure, trenches have a top (surface 12), two sidewalls 16 extending down from a surface 12 and a bottom 18. Features can have any suitable aspect ratio (ratio of the depth D of the feature to the width W of the feature at its opening). In some embodiments, the aspect ratio is greater than or equal to about 5:1, 10:1, 15:1, 20:1, 25:1, 30:1, 35:1 or 40:1. The width W of the feature in some embodiments is less than or equal to about 25 nm, 20 nm, 16 nm, 14 nm, 12 nm, 10 nm or 8 nm. In some embodiments, each sidewall 16 is substantially orthogonal to bottom 18. In some embodiments, each sidewall 16 is slanted relative to bottom 18 at an angle other than 90 degrees, so that the opening at the surface is greater than at lower portion of the feature 14. The open area formed by the sidewalls 16 and bottom 18 are also referred to as a gap. Materials which fill the gap are referred to as gapfill.

Figure 2:
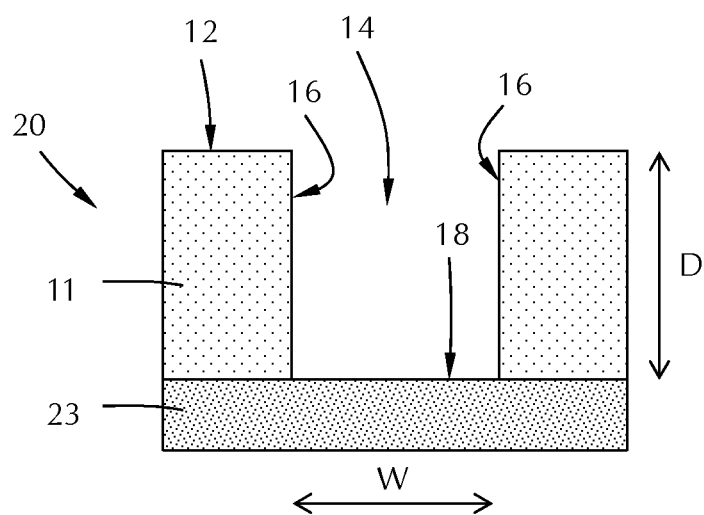
FIG. 2 shows a schematic cross-sectional view of a dual material substrate in accordance with one or more embodiment of the disclosure.

In some embodiments, as illustrated in FIG. 2, the substrate 20 includes two materials—a first material and a second material—that are arranged/patterned to form at least one feature 14. In some embodiments, the two materials include an underlayer 23 with a patterned first material 11 thereon. In some embodiments, the underlayer 23 is a metal underlayer comprising any suitable metal and the first material 11 comprises a dielectric with a first material surface 12. In some embodiments, the underlayer 23 comprises a dielectric and the first material 11 comprises a metal film. The first material 11 is patterned by any suitable patterning process known to the skilled artisan to form a feature 14 with sidewalls 16 and a bottom 18. In the embodiment of FIG. 2, the sidewalls of the feature 14 are formed by the patterned first material 11 and the bottom 18 of the feature is formed by the underlayer 23.

In some embodiments, the first material 11 comprises a dielectric. Suitable dielectrics include, but are not limited to, silicon oxide, silicon nitride, silicon carbide, silicon oxynitride, silicon oxycarbide, silicon carbonitride or silicon oxycarbonitride. In some embodiments, the first material 11 comprises a metal film (i.e., a conductive film).

Figure 3:
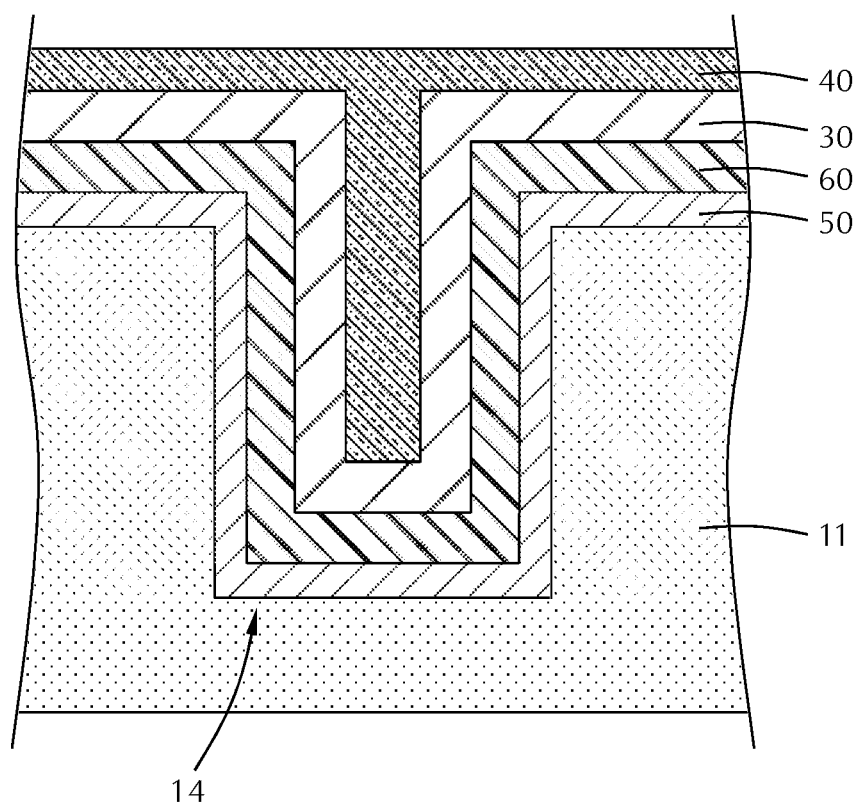
FIG. 3 shows a schematic cross-sectional view of a portion of a single material substrate with gapfill material in accordance with one or more embodiment of the disclosure.
Figure 4:
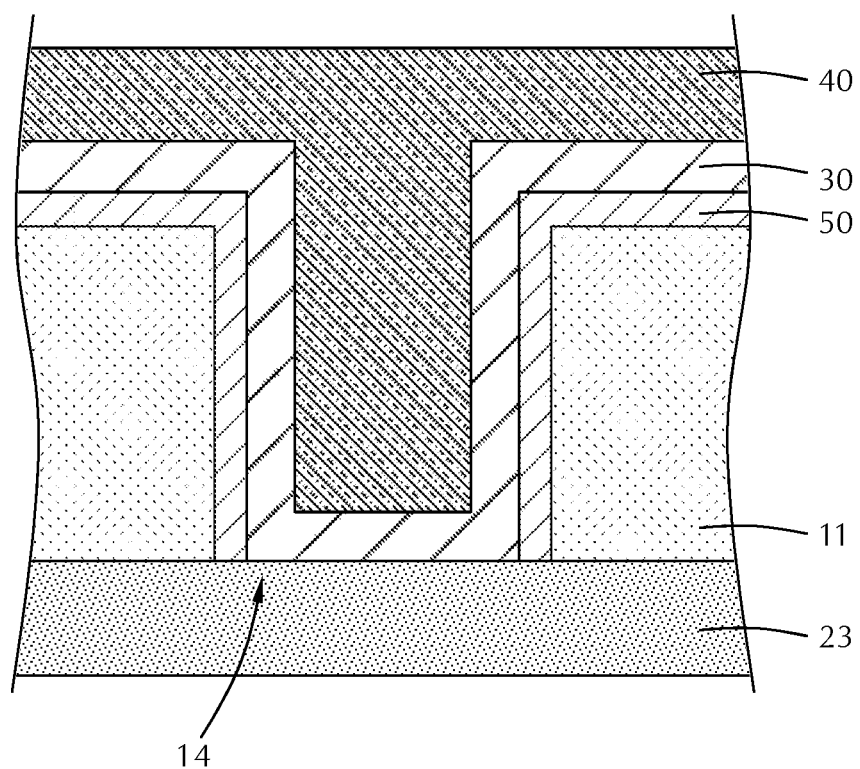
FIG. 4 shows a schematic cross-sectional view of a portion of a dual material substrate with gapfill material in accordance with one or more embodiment of the disclosure.

FIG. 3 illustrates an embodiment of the disclosure in which the substrate 10 (FIG. 3) comprises a single material 11. FIG. 4 illustrates an embodiment of the disclosure in which the substrate 20 comprises an underlayer 23 with a patterned first material 11 thereon. The combination of films/layers illustrated in FIGS. 3 and 4 are not specific to the substrate 10 or substrate 20. For example, the embodiment illustrated in FIG. 4 does not have at least one layer that is illustrated in FIG. 3. This is merely for descriptive purposes and the skilled artisan will recognize that the various disclosed films/layers can be formed on various substrates.

Some embodiments of the disclosure are directed to methods of depositing a gapfill material in the feature 14. The gapfill material of some embodiments comprises, consists essentially of, or consists of metallic copper. As used in this manner, the term "consists essentially of" means that the film is greater than or equal to about 95%, 98% or 99% of the stated element, on an atomic basis. The composition of the film refers to the bulk portion of the film, not including the interface regions at the top and bottom of the film which may have atoms of the adjacent films migrated or diffused therein.

A copper gapfill seed layer 30 is deposited on the substrate surface (i.e., the surface 12 of the first material 11). The copper gapfill seed layer 30 is deposited by atomic layer deposition (ALD). Atomic layer deposition (ALD) film growth can be done by time-domain process or a spatial ALD process. In a time-domain process, the entire substrate surface is exposed to a first reactive gas, purged of the first reactive gas, exposed to a second reactive gas and purged of the second reactive gas in sequence. In a spatial ALD process, the various reactive gases are flowed into separate regions of a processing chamber and the substrate is moved between the regions to sequentially expose the substrate to the reactive gases.

In some embodiments, the copper gapfill seed layer 30 is a conformal layer. A conformal film has the same thickness at the top of the feature as the bottom of the feature. In some embodiments, the conformality of the film is measured as the average of the thickness at the top of the feature relative to the average thickness, the thickness at the middle of the feature relative to the average thickness and the thickness at the bottom of the feature relative to the average thickness. In some embodiments, the copper gapfill seed layer 30 has a conformality greater than or equal to about 90%, 91%, 92%, 93%, 94%, 95%, 96%, 97%, 98% or 99%.

The copper gapfill seed layer 30 can be metallic copper or a copper nitride film. In some embodiments, the copper gapfill seed layer 30 is deposited as a metallic copper film. For example, the substrate can be exposed to a copper precursor and a suitable reductant to form a metallic copper film. Suitable copper precursors include, but are not limited to, Cu(DMAP)$_2$ (DMAP=a sec-aminoalkoxide or derivatives thereof, where R1, R2, R3 equal methyl, ethyl).

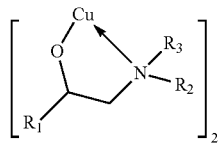

Suitable reactants to form a metallic copper film include, but are not limited to, H$_2$, and plasmas of one or more of Ar, He, N$_2$, Ne, H$_2$.

In some embodiments, the copper gapfill seed layer 30 is deposited as a copper nitride film and converted to a copper film. A copper nitride film can be deposited by sequential exposure of the substrate to a suitable copper precursor and a suitable reactant. Suitable reactants for nitride formation include, but are not limited to, N$_2$, NH$_3$, pyridine, hydrazine and plasmas thereof. In some embodiments, the copper nitride film is converted to a copper film by thermal decomposition prior to filling the feature. In some embodiments, converting the copper nitride film occurs at the same time as filling the feature with copper.

The copper gapfill seed layer 30 is deposited to a thickness sufficient to act as a nucleation enhancing layer for a subsequent PVD copper deposition process. In some embodiments, the copper gapfill seed layer 30 has a minimum thickness to form a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film. In some embodiments, the copper gapfill seed layer is a continuous film having an average thickness less than or equal to about 5 nm, 4 nm, 3 nm or 2 nm. In some embodiments, the copper gapfill seed layer 30 has a thickness in the range of about 1 nm to about 3.5 nm, or in the range of about 1.5 nm to about 3 nm, or in the range of about 2 nm to about 2.5 nm.

The copper gapfill seed layer 30 is deposited at a first temperature. In some embodiments, the first temperature is in the range of about room temperature to about 150° C., or in the range of about 50° C. to about 130° C., or in the range of about 80° C. to about 120° C.

In some embodiments, the after formation of the copper gapfill seed layer 30, the substrate is exposed to conditions to convert the copper gapfill seed layer 30 to a metallic copper film. Suitable conditions include, but are not limited to, annealing in an H$_2$ and/or Ar gas flow at a temperature greater than or equal to about 130° C. In some embodiments, the copper gapfill seed layer 30 is converted to a metallic copper film by pre-heating the substrate in a high temperature vacuum, such as the PVD chamber used for subsequent deposition of the PVD Cu film.

After formation of the copper gapfill seed layer 30, the feature 14 is filled with copper film 40 by physical vapor deposition (PVD) at a second temperature greater than the first temperature to form a seam-free gapfill film. A seam is any opening or void between the sidewalls 16 of the feature 14. A seam-free gapfill means that there is less than or equal to about 2%, 1% or 0.5% void on a volume basis.

The substrate can be moved from an ALD chamber to a PVD chamber for gapfilling with the PVD Cu film. In some embodiments, the second temperature is in the range of about 100° C. to about 400° C., or in the range of about 125° C. to about 350° C., or in the range of about 150° C. to about 250° C. The temperature during the PVD deposition of the copper film 40 is greater than the temperature during the ALD deposition of the copper gapfill seed layer 30.

In some embodiments, the substrate surface has a diffusion barrier 50 formed on surface 12 and sidewalls 16 of the features 14. The embodiment illustrated in FIG. 4 shows the diffusion barrier on the sidewalls 16 of the features 14 and not on the bottom 18 of the feature 14. For example, the diffusion barrier 50 is formed on the top surface and sidewalls of the feature of the patterned film. In some embodiments, the diffusion barrier 50 is also formed on the bottom 18 of the feature 14, as illustrated in FIG. 3. In some embodiments, the diffusion barrier 50 is formed on the bottom of the feature on the underlayer 23.

The diffusion barrier 50 can be any suitable material including, but not limited to, tantalum nitride. In some embodiments, the diffusion barrier 50 comprises or consists essentially of tantalum nitride. As used in this manner, the term "consists essentially of" means that the bulk of the film is greater than or equal to about 95%, 98% or 99% of the stated compound on an elemental basis. For example, a diffusion barrier 50 consisting essentially of tantalum nitride is greater than or equal to about 95%, 98% or 99% of the sum of the tantalum and nitrogen atoms in the film.

In some embodiments, the copper gapfill seed layer 30 is formed directly on the diffusion barrier 50, as shown in FIG. 4. As used in this manner, the term "formed directly on" means that there is no intervening layer between the diffusion barrier 50 and the gapfill seed layer 30. In some embodiments, as shown in FIG. 3, there is at least one intervening layer between the diffusion barrier 50 and the gapfill seed layer 30.

The diffusion barrier 50 can be formed by any suitable process known to the skilled artisan. For example, the diffusion barrier 50 can be formed by one or more of atomic layer deposition, chemical vapor deposition or physical vapor deposition. The diffusion barrier 50 can be formed in the same process chamber as the copper gapfill seed layer 30 or in a different processing chamber.

In some embodiments, an optional liner 60 is formed on the diffusion barrier 50. The optional liner 60 can be formed conformally on the sidewalls and bottom of the features and on the surface of the patterned material. In some embodiments, the liner 60 comprises one or more of cobalt or ruthenium. In some embodiments, the liner consists essentially of cobalt. In some embodiments, the liner 60 consists essentially of ruthenium. The liner 60 can be deposited by any suitable process known to the skilled artisan. For example, the liner 60 can be formed by one or more of atomic layer deposition, chemical vapor deposition or physical vapor deposition. The liner 60 can be formed in the same process chamber as the copper gapfill seed layer 30 or in a different processing chamber.

Figure 5:
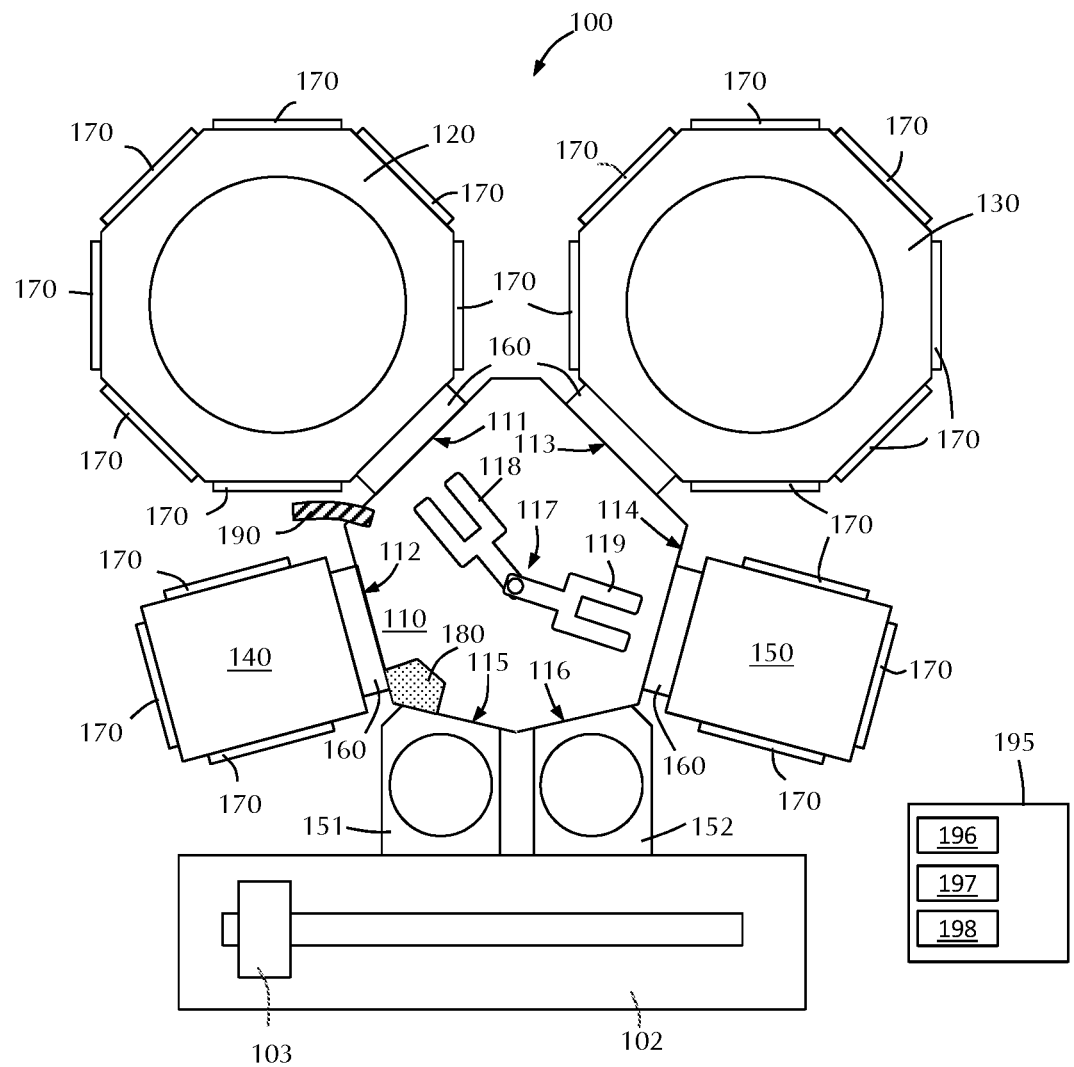
FIG. 5 shows a schematic view of a processing platform to deposit a gapfill material in accordance with one or more embodiment of the disclosure.

Some embodiments of the disclosure are directed to processing platforms for forming a copper gapfill. FIG. 5 shows a processing platform 100 in accordance with one or more embodiment of the disclosure. The embodiment shown in FIG. 5 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The transfer station 110 shown has a first side 111, a second side 112, a third side 113, a fourth side 114, a fifth side 115 and a sixth side 116. Although six sides are shown, those skilled in the art will understand that there can be any suitable number of sides to the transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A batch processing chamber 120 can be connected to a first side 111 of the central transfer station 110. The batch processing chamber 120 can be configured to process x wafers at a time for a batch time. In some embodiments, the batch processing chamber 120 can be configured to process in the range of about four (x=4) to about 12 (x=12) wafers at the same time. In some embodiments, the batch processing chamber 120 is configured to process six (x=6) wafers at the same time. As will be understood by the skilled artisan, while the batch processing chamber 120 can process multiple wafers between loading/unloading of an individual wafer, each wafer may be subjected to different process conditions at any given time. In some embodiments, the batch processing chamber 120 is an atomic layer deposition chamber configured to deposit a copper gapfill seed layer on a substrate.

The processing platform 100 includes a physical vapor deposition (PVD) chamber 140 connected to a second side 112 of the central transfer station 110. The PVD chamber 140 of some embodiments is configured to deposit a copper gapfill layer after formation of the copper gapfill seed layer.

In some embodiments, the processing platform further comprises a second batch processing chamber 130 connected to a third side 113 of the central transfer station 110. The second batch processing chamber 130 can be configured similarly to the batch processing chamber 120, or can be configured to perform a different process or to process different numbers of substrates. For example, the second batch processing chamber 130 of some embodiments is configured to form a barrier layer on a substrate.

In the embodiment shown in FIG. 5, the processing platform 100 includes a second PVD chamber 150 connected to a fourth side 114 of the central transfer station 110. The second PVD chamber 150 can be the same as the PVD chamber 140 or different.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the transfer station 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the platform 100. A robot 103 within the factory interface 102 can be moved the wafers or cassettes into and out of the buffer stations 151, 152. The wafers or cassettes can be moved within the platform 100 by the robot 117 in the central transfer station 110. In some embodiments, the factory interface 102 is a transfer station of another cluster tool.

A controller 195 may be provided and coupled to various components of the processing platform 100 to control the operation thereof. The controller 195 can be a single controller that controls the entire processing platform 100, or multiple controllers that control individual portions of the processing platform 100. For example, the processing platform 100 may include separate controllers for each of the individual processing chambers, central transfer station, factory interface and robots. In some embodiments, the controller 195 includes a central processing unit (CPU) 196, a memory 197, and support circuits 198. The controller 195 may control the processing platform 100 directly, or via computers (or controllers) associated with particular process chamber and/or support system components. The controller 195 may be one of any form of general-purpose computer processor that can be used in an industrial setting for controlling various chambers and sub-processors. The memory 197 or computer readable medium of the controller 195 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 198 are coupled to the CPU 196 for supporting the processor in a conventional manner. These circuits include cache, power supplies, clock circuits, input/output circuitry and subsystems, and the like. One or more processes may be stored in the memory 198 as software routine that may be executed or invoked to control the operation of the processing platform 100 or individual processing chambers in the manner described herein. The software routine may also be stored and/or executed by a second CPU (not shown) that is remotely located from the hardware being controlled by the CPU 196.

In some embodiments, the controller 195 has at least one configuration selected from a first configuration to move a substrate to the batch processing chamber (e.g., ALD chamber), a second configuration to deposit a copper gapfill seed layer on the substrate, a third configuration to move the substrate from the ALD chamber to the PVD chamber, a fourth configuration to heat the substrate in the PVD chamber, a fifth configuration to deposit a copper gapfill film in the PVD chamber, a sixth configuration to deposit a barrier layer on the substrate and/or a seventh configuration to deposit a liner on the substrate. The configurations can include any commands or functions to control flow rates, gas valves, gas sources, rotation, movement, heating, cooling, or other processes for performing the various configurations.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of gapfilling, the method comprising:
    forming a copper gapfill seed layer by atomic layer deposition (ALD) on a substrate surface having a feature thereon, the atomic layer deposition occurring at a first temperature; and
    filling the feature with copper by physical vapor deposition (PVD) at a second temperature greater than the first temperature to form a seam-free gapfill film,
    wherein forming the copper gapfill seed layer comprises depositing a copper nitride film and converting the copper nitride film to a copper film by thermal decomposition prior to filling the feature with copper by PVD or at the same time as filling the feature with copper by PVD.

2. The method of claim 1, wherein forming the copper gapfill seed layer comprises depositing a metallic copper film.

3. The method of claim 1, wherein the substrate surface has a tantalum nitride film thereon and the copper gapfill seed layer is formed on the tantalum nitride film.

4. The method of claim 3, wherein the copper gapfill seed layer is formed directly on the tantalum nitride film.

5. The method of claim 3, wherein the substrate surface further comprises a cobalt liner on the tantalum nitride film and the copper gapfill seed layer is formed on the cobalt liner.

6. The method of claim 1, wherein the substrate surface comprises a metal underlayer with a patterned dielectric layer thereon, the feature formed in the patterned dielectric layer with the metal underlayer as the bottom of the feature.

7. The method of claim 6, further comprising a tantalum nitride layer formed on a top surface and feature sidewalls of the patterned dielectric layer.

8. The method of claim 7, wherein the tantalum nitride layer is also formed on the metal underlayer at the bottom of the feature.

9. The method of claim 1, wherein the copper gapfill seed layer is a continuous film having a thickness less than or equal to about 3 nm.

10. A method comprising:
providing a substrate having a metal underlayer with a patterned dielectric layer thereon, the patterned dielectric layer defining one or more features in a surface of the substrate, the features having sidewalls and a bottom, the sidewalls comprising the patterned dielectric layer and the bottom comprising the metal underlayer;
forming a diffusion barrier on the substrate surface and on the sidewalls of the features;
forming an optional liner on the diffusion barrier on the substrate surface, sidewalls of the features and on the bottom of the features;
forming a copper gapfill seed layer by atomic layer deposition (ALD) at a first temperature on the substrate surface; and
filling the feature with copper by physical vapor deposition (PVD) at a second temperature greater than the first temperature to form a seam-free gapfill film,
wherein forming the copper gapfill seed layer comprises depositing a copper nitride film and converting the copper nitride film to a copper film by thermal decomposition prior to filling the feature with copper by PVD or at the same time as filling the feature with copper by PVD.

11. The method of claim 10, wherein forming the copper gapfill seed layer comprises depositing a metallic copper film.

12. The method of claim 10, wherein with feature has a width in the range of about 12 to about 20 nm, the diffusion barrier has a thickness of about 1 nm, the optional liner has a thickness of about 1 nm to about 1.5 nm, and the copper gapfill seed layer has a thickness in the range of about 2 to about 2.5 nm.

13. The method of claim 10, wherein the liner comprises one or more of cobalt or ruthenium.

* * * * *